United States Patent [19]

Xin et al.

[11] Patent Number: 5,332,721
[45] Date of Patent: Jul. 26, 1994

[54] METHOD OF FABRICATING THALLIUM-CONTAINING CERAMIC SUPERCONDUCTORS

[75] Inventors: Ying Xin, Lawrence, Kans.; Zhengzhi Sheng; Yufang Li, both of Fayetteville, Ark.

[73] Assignees: Midwest Superconductivity, Inc., Lawrence, Kans.; The University of Arkansas, Fayetteville, Ark.

[21] Appl. No.: 964,555

[22] Filed: Oct. 21, 1992

Related U.S. Application Data

[63] Continuation-in-part of Ser. No. 791,892, Nov. 13, 1991, abandoned.

[51] Int. Cl.$^5$ .............. C01F 11/02; C01G 3/02; C01G 15/00; H01L 39/24
[52] U.S. Cl. .................. 505/492; 505/725; 505/742; 505/783; 505/501
[58] Field of Search .............. 505/1, 783, 725, 742; 252/521, 518; 423/604, 624, 635

[56] References Cited

U.S. PATENT DOCUMENTS

| | | | |
|---|---|---|---|
| 4,894,361 | 1/1990 | Subramanian | 423/624 |
| 4,929,594 | 5/1990 | Gopalakrishnan et al. | 505/783 |
| 4,988,668 | 1/1991 | Engler | 505/783 |
| 5,021,400 | 6/1991 | Block | 505/783 |
| 5,082,825 | 1/1992 | Hermann | 505/783 |

FOREIGN PATENT DOCUMENTS

| | | | |
|---|---|---|---|
| 0308803 | 12/1989 | Japan | 505/783 |
| 0313325 | 12/1989 | Japan | 505/783 |
| 0196025 | 8/1990 | Japan | 505/783 |
| 0097621 | 4/1991 | Japan | 505/783 |
| 3097621 | 4/1991 | Japan | 505/783 |
| 0150223 | 6/1991 | Japan | 505/783 |

OTHER PUBLICATIONS

Takahashi et al. "Preparation and properties of Tl-Ca-Ba-Cu-O" *Jap. Jnl. Appl. Phys.* vol. 27(8) Aug. 1988 pp. L1457-L1459.
Torardi "Crystal structure of $Tl_2Ba_2Ca_2 Cu_3O_{10}$, a 125K Superconductor" *Science* vol. 240 Apr. 29, 1988 pp. 631-633.
Liang "Crystal structures and superconductivity of ..." *Physica C* vol. 156 Nov. 1, 1988 pp. 616-624.
Lin, et al, "Process and Resistivity ... in Tl-Ca-Ba-Cu-O," Jul., 1988, Jap. Jr. of Appl. Phy., vol. 27, No. 7, pp. L1206-L1208.
Wu, et al, "Synthesis of TlCaBaCuO ... Mixtures",, 1989, Physica C 161, pp. 302-312.
Morosin, et al, "Crystal Structure of TlCaBaCuO," Nov. 1, 1988, Physica C 156, pp. 587-591.
Hibble, et al, "Relationship Between ... In The TlBaCaCuO Superconductors," Nov. 1, 1988, Physica C 156, pp. 604-606.

*Primary Examiner*—Paul Lieberman
*Assistant Examiner*—John Boyd
*Attorney, Agent, or Firm*—Hovey, Williams, Timmons & Collins

[57] ABSTRACT

An improved technique for the fabrication of thallium-based superconducting oxides, and particularly Tl:Ba:Ca:Cu:O 2223 oxides, is described which allows production of very pure superconductors (>95% 2223 phase) having excellent structural characteristics. The method of the invention involves first forming a self-sustaining body of starting oxides and subjecting this body to a sintering technique wherein the temperature of the body is gradually raised to a maximum level of about 850°–930° C., followed by maintaining the body at this temperature for a period of about 48 hours. The body is then slowly cooled to avoid distortion and loss of superconducting character. Most preferably, the sintering is a two-stage operation, wherein the body is first heated a relatively low rate (e.g., 1°–10° C./min.) to a temperature of about 650°–750° C., followed by faster heating at a higher rate to achieve the maximum sintering temperature. Cooling is likewise staged, involving slow cooling at a rate of about 0.1°–5° C./min. until a temperature of about 600°–650° C. is reached, where the body is maintained at this temperature for about 5–20 hours. Final cooling is allowed to occur naturally down to ambient temperature.

12 Claims, 4 Drawing Sheets

METHOD OF FABRICATING THALLIUM-CONTAINING CERAMIC SUPERCONDUCTORS

This application is a continuation-in-part of application Ser. No. 07/791,892, filed Nov. 13, 1991, now abandoned.

BACKGROUND OF THE INVENTION

1. Field of the Invention

This invention relates to a method of fabricating thallium-containing superconducting oxides (and especially the Ti:Ba:Ca:Cu 2223 phase oxides) through use of an optimized sintering/cooling schedule which gives resultant oxides which are both relatively pure (greater than 95%) and which exhibit substantial mechanical strength and structural integrity. More particularly, it is concerned with such a fabrication method, wherein a compressed body formed of non-superconducting starting oxides is subjected to a sintering process wherein the temperature of the body is gradually raised to maximum level of from about 850°–930° C., and is maintained at this temperature for a period of at least about 24 hours; thereupon, the body is cooled, preferably by a staged cooling process, in order to yield the final superconducting oxides.

2. Description of the Prior Art

Superconductivity refers to that special state of a material where its resistance to electrical current flow suddenly and completely disappears when its temperature is lowered. Below this onset or critical temperature $T_c$, a characteristic of the material, the electrical resistance does not merely drop to a low level but it vanishes entirely. Only a very limited list of materials exhibit such a state. The discovery of the first superconductor occurred in 1911. Heike Kammerlingh Onnes discovered that mercury lost all detectable resistance at a temperature just 4° above absolute zero.

A superconductor also exhibits perfect diamagnetism below its critical temperature, i.e., it expels all magnetic field lines from its interior by producing an opposing magnetic field from a current flowing on its surface. As a consequence of the perfect diamagnetism of superconductors, they can be used to produce magnetic levitation as envisioned in high speed transport systems of the future, where magnetic repulsion is used to counter gravity. The perfect diamagnetism property of superconductors is called the Meissner effect after its discoverer.

One class of superconducting oxides heretofore examined are the high $T_c$ Tl-Ba-Ca-Cu-O superconducting oxides, especially the 2223 oxides. The conventional method of preparing such oxides is to heat the primary oxides (e.g., $Tl_2O_3$, BaO, CaO and CuO) at temperatures close to the melting point of the thallium oxide for a short period of time, usually 5–60 minutes. Such short sintering is done to avoid sublimation of Tl, but the period is too short for the chemical components to react sufficiently. While these superconductors show considerable promise, they are plagued by a number of problems attributable to the method of fabrication thereof. For example, the conventional fabrication method usually results in a majority of 2212 superconducting phase and only a smaller amount of the higher $T_c$ (greater than 120° K.) 2223 phase. Moreover, it is sometimes difficult to fabricate large volumes of the oxides using the conventional techniques, owing to the fact that thallium may sublimate during sintering or escape of water vapor may cause cracking. Accordingly, conventional techniques do not provide high quality, essentially single phase thallium-based superconducting oxides. Morosin et al., "Crystal Structure of $TlCa_2Ba_2Cu_3O_9$", Physica C 156 (1988), p. 587–591 describe the production of single crystal superconductors, i.e., crystals consisting of identical unit cells all of which are aligned along an identical crystal axis. Such materials are to be contrasted with polycrystalline superconductors wherein the unit cells are not aligned along a common crystal axis. Thus, polycrystalline superconductors may be viewed as a composite of randomly oriented grains each made up of single crystals. As can be appreciated, virtually all bulk superconductors are polycrystalline in character, whereas single crystal materials are generally limited to thin film systems.

It has also been known to produce mixed phase thallium superconductors containing a majority of phases such as 2212 and 2201, with only a relatively small proportion of the most desirable, high $T_c$ 2223 phase. These mixed phase superconductors inevitably exhibit lower critical temperatures and are therefore deficient.

SUMMARY OF THE INVENTION

The present invention overcomes the problems outlined above, and provides a greatly improved method for the fabrication of thallium-containing superconducting oxides. In the method, respective quantities of non-superconducting starting oxides are provided to achieve the desired final superconducting oxide, and these starting oxides are ground to achieve a powdered, homogeneous mixture. Such grinding may be effected by wet grinding using methanol or other organic solvent, or manually in an agate mortar. Preferably, the average particle size of the ground oxides should be on the order of 0.5 microns. If wet grinding is employed, the material should then be dried by conventional means. In alternative procedures, the starting non-superconducting oxides may be $Tl_2O_3$ and Ba:Ca:Cu oxides. The latter may be produced from $BaCO_3$, $CaCO_3$ and CuO by mixing and heating the oxides together at 850°–900° C. for about 20 hours.

In the next step of the method, the powdered, homogeneous mixture is compressed to form a self-sustaining body. Here again, this technique is well know, and usually involves use of a press. A 15 ton/cm² laboratory press has been used to good effect in this step. The bodies resulting from this process should have a diameter of from about ½–3" and a thickness of from about ¼–1".

The compressed body of starting oxides is then subjected to a sintering process in an oxygen-rich atmosphere (i.e., an atmosphere which is at least about 50% by weight oxygen, and more preferably at least about 85% by weight oxygen) which broadly includes the steps of gradually raising the temperature of the body to a maximum level of from about 850°–930° C., and maintaining the body at this temperature for a period of at least about 24 hours. Gradual heating in this fashion is important in order to prevent overly rapid escape of moisture from the body, which can cause cracking thereof.

In particularly preferred forms, the sintering involves first subjecting the body to a relatively low heating rate to an intermediate temperature on the order of 650°–750° C., and thereafter further sintering the body at a second, relatively high heating rate to achieve the maximum temperature level of about 850°-930° C. In practice, the first, low heating rate should be from about 1°-10° C./min., and more preferably from about 2°-5° C./min. The intermediate temperature level is most preferably about 700° C. Use of these optimized conditions prevents cracking of the compressed bodies until the intermediate temperature of about 700° C. is reached. After this temperature, the thallium oxide tends to sublimate from the body; accordingly, the faster heating rate is applied after this temperature, in order to complete the sintering process before excessive thallium sublimation is allowed to occur. Accordingly, the highest practical heating rate is used after the intermediate temperature level is reached, which is normally in the range of from about 15°-30° C./min., and most preferably about 20° C./min. Broadly speaking therefore, the gradual heating of the compressed body should be carried out at a heating rate of from about 1 to about 30° C./min.

Maintaining the temperature of the body at the maximum temperature level serves to complete the sintering process and achieve the crystalline structure necessary for a high $T_c$ superconductor. Generally speaking, the maximum temperature should be maintained for a period of at least 24 hours, more preferably from about 30-60 hours.

During the cooling cycle, the body is allowed to return to ambient temperature. Advantageously, cooling is also a two-stage operation, involving first cooling to a level of from about 600°-650° C., and maintaining the body at this temperature for a period of from about 5-20 hours, whereupon the body is then allowed to furnace cool (i.e., the furnace is shut down) to ambient. The most preferred cooling schedule involves initially cooling at a rate of from about 0.1°-5° C./min. to the 600°-650° C. level, with maintenance at this temperature for a period of about 10 hours, with final furnace cooling. A low cooling rate can be very important in that too rapid cooling can cause distortion of the body and degeneration of superconducting properties.

The superconducting oxides having the general formula $Tl_xBa_2Ca_qCu_dO_{10-y}$, where x ranges from about 1-2.5, z ranges from about 0.5-2, q ranges from about 1.5-3, d ranges from about 3-4, and y is an oxygen deficiency factor which is less than about 1 can readily be produced using the techniques of the invention. Doping of the above class of superconductors is also possible, so that the formula $Q_nTl_xBa_2Ca_qCu_dO_{10-y}$ is applicable, where Q is a dopant selected from the group consisting of Rb, Hg, Cr, Re, K, Na, Se and Te and n ranges from about 0.05-0.5, and more preferably from about 0.05 to 0.2.

In preferred aspects, the method of the invention is particularly suited for the production of polycrystalline, substantially single phase thallium 2223 superconductors having at least about 90% by weight, and more preferably at least about 95% by weight, of the 2223 phase.

DETAILED DESCRIPTION OF THE PREFERRED EMBODIMENTS

Figure 1:
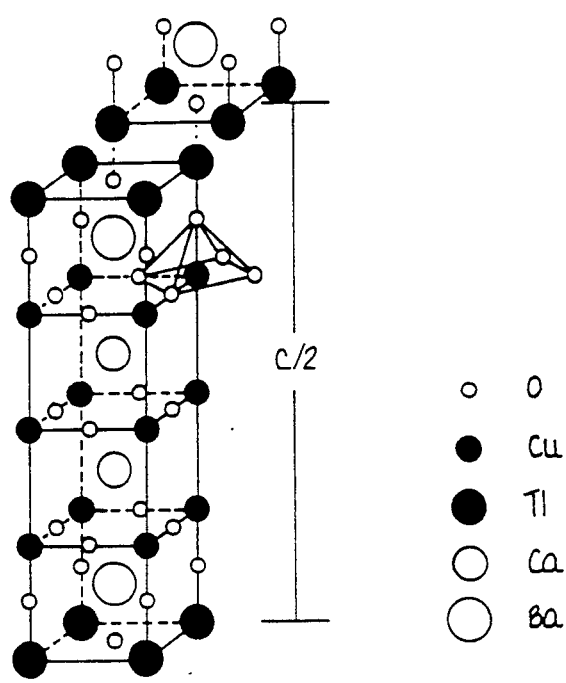
FIG. 1 is a schematic representation of the stacked crystalline structure of the Ti:Ba:Ca:Cu:O 2223 superconducting oxides fabricated in accordance with the method of the invention.
Figure 8:
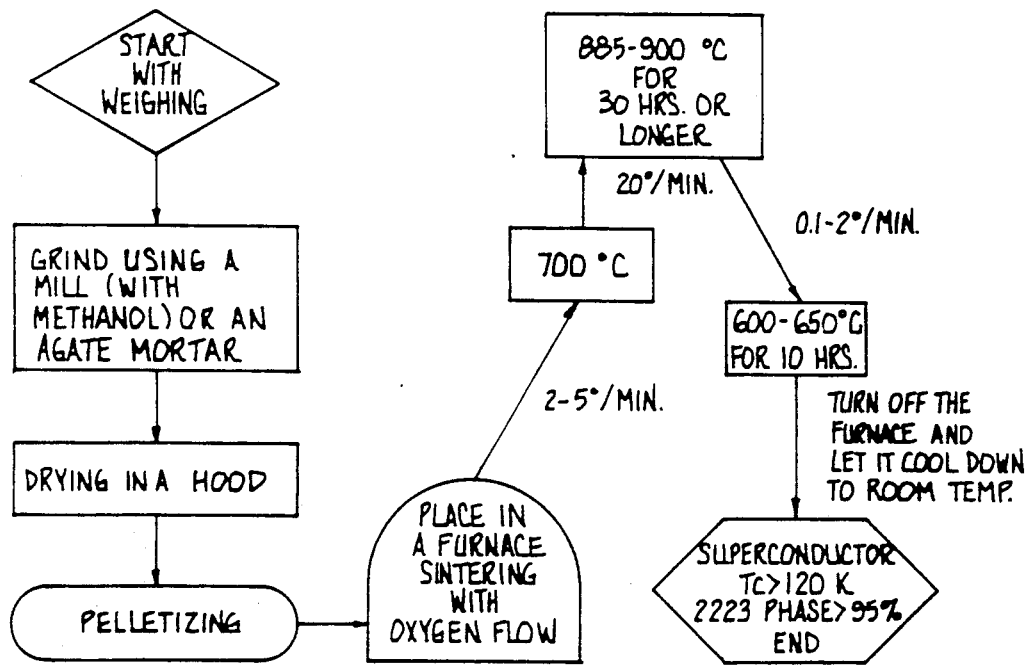
FIG. 8 is a flow diagram illustrating the steps of the most preferred fabrication technique for the production of thallium-based 2223 superconductors

The following example describes a number of techniques within the ambit of the present invention for the production of thallium-based superconductors. It is to be understood that the examples are by way of illustration only, and nothing therein should be taken as a limitation upon the overall scope of the invention. The 2223 superconductors described in the following examples have the crystalline structure illustrated in FIG. 1; the most preferred technique for the production of such 2223 superconductors is illustrated in FIG. 8.

EXAMPLE

In this series of runs, various thallium-containing superconducting oxides were fabricated. In all cases, the starting oxides employed were CaO (>99% pure), CuO (>99.95% pure), $BaO_2$ or BaO (>95% pure), $Tl_2O_3$ (>99.99% pure) and $Rb_2CO_3$ (>99.99% pure), where appropriate.

$Tl_2Ba_2Ca_2Cu_3O_{10-y}$

The appropriate molar ratios of the above oxides sufficient to yield the above were mixed with a quantity of methanol to give a fluid mixture and ground in a laboratory machine mill for about 10 hours. The average particle size of the mixture was estimated to be on the order of 0.5 microns. The ground mixture was then dried in a ventilation hood to remove the methanol. The dried mixture was again ground to a fine powder using an agate mortar. Thereupon, the mixed powder was pelletized using a laboratory hydraulic press (15 tons/cm$^2$).

The pellets resulting from this process (typically ½-1" diameter and about ½" in thickness) were then placed inside a pair of closed-ended, tubular, telescopically interfitted alumina crucibles. This crucible was then placed in a tube furnace with oxygen flow through the furnace in the usual manner.

The pellets were sintered using the following heating schedule. The room temperature furnace was first heated to 700° C., using a heating rate of 5° C./min. Thereafter, the furnace was further heated to 890° C., at a heating rate of 20° C./min. When the furnace reached 890° C., the furnace temperature was maintained at this temperature for 40 hours. At the end of the 40-hour period, the temperature of the furnace was reduced to 650° C., at a cooling rate of 1° C./min. The 650° C.

furnace temperature was maintained for 10 hours, whereupon the furnace was turned off and allowed to return to ambient.

Figure 2:
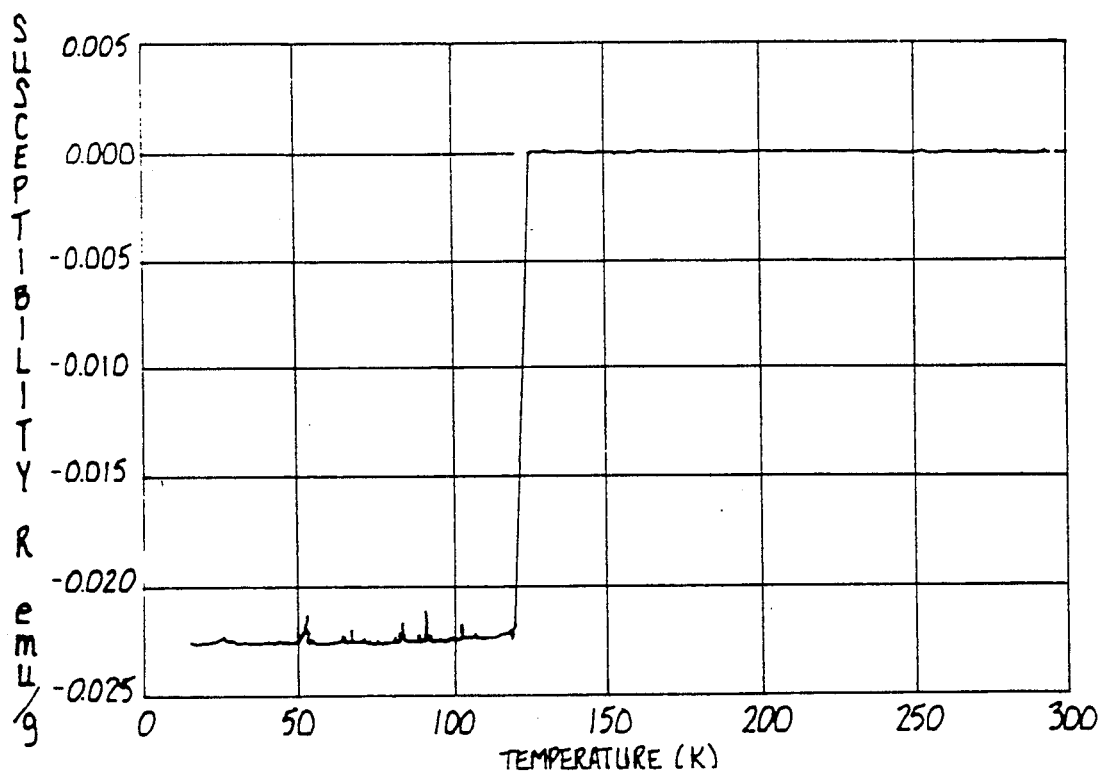
FIG. 2 is a susceptibility curve (Meissner effect) generated using a $Tl_2Ba_2Ca_2Cu_3O_{10-y}$ superconductor fabricated using the method of the invention.
Figure 3:
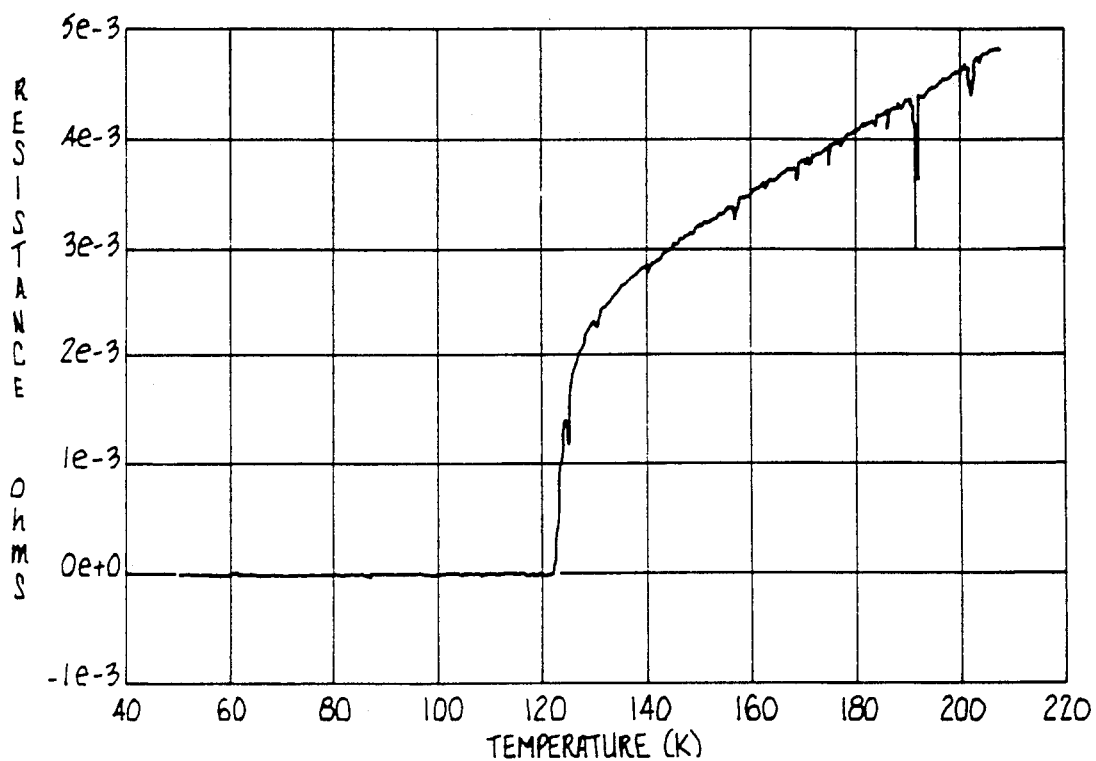
FIG. 3 is a resistivity curve generated using the FIG. 2 superconductor.
Figure 4:
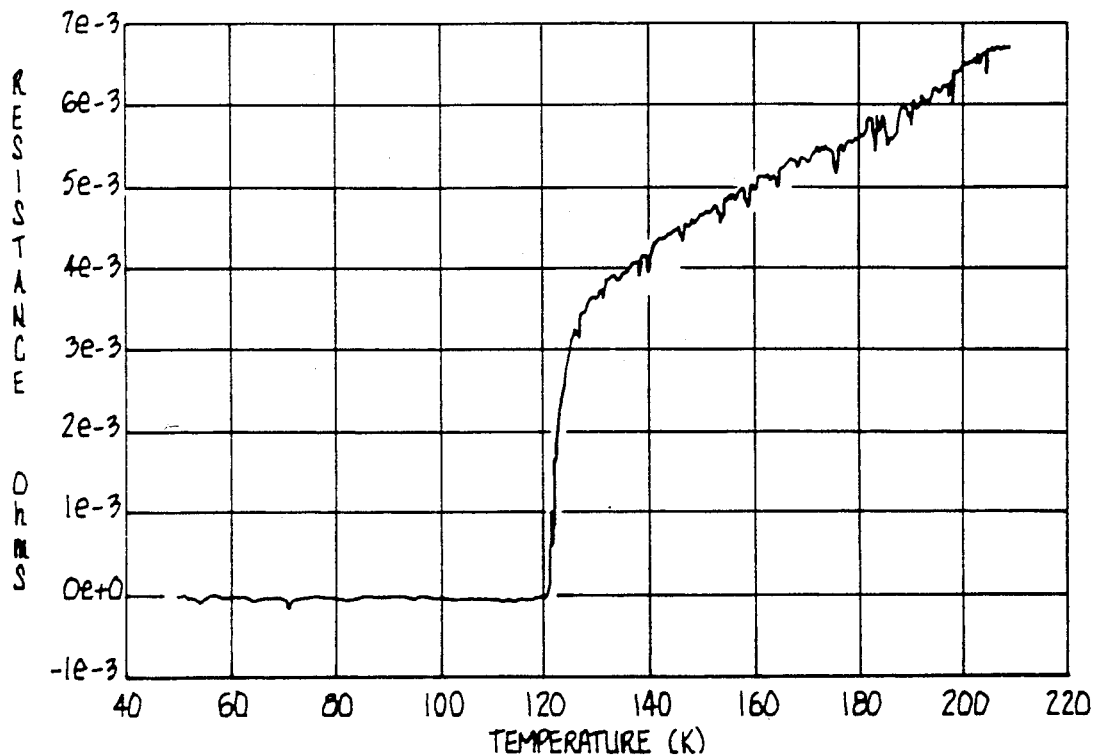
FIG. 4 is a resistivity curve of another $Tl_2Ba_2Ca_2Cu_3O_{10-y}$ superconductor fabricated using a somewhat different technique in accordance with the invention.

The ceramic oxide produced in accordance with this method was shown to be superconducting, by way of susceptibility (FIG. 2) and resistance (FIG. 3) tests. These tests were conducted in the standard fashion, and demonstrated a $T_c$ on the order of 120° K. Moreover, the oxide was very pure having a 2223 phase of at least In another test, the same oxide was fabricated, using a somewhat different heating/cooling cycle. Specifically, when the pellets inside of the alumina boats were placed in the furnace, the furnace was first raised from room temperature to 700° C., at a heating rate of 5° C./min. The furnace temperature was further elevated to 895° C. at a faster heating rate of 20° C./min. Thereafter, the furnace was maintained at 895° C. for 48 hours. In the cooling cycle, the furnace temperature was first lowered to 650° C. at a cooling rate of 1° C./min, whereupon the furnace was maintained at 650° C. for 10 hours. At this point, the furnace was shut off, and allowed to cool to ambient. FIG. 4 illustrates the resistance curve generated using the pellets derived from this experiment. Again, a $T_c$ of slightly greater than 120° K. was determined, and the composition had a 2223 phase purity on the order of 95%.

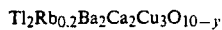
$Tl_2Rb_{0.2}Ba_2Ca_2Cu_3O_{10-y}$

This example illustrates fabrication of a doped 2223 composition. Fabrication and handling of the pellets prior to the heating/cooling cycle was carried out exactly as described previously, with the only difference being the use of $Rb_2CO_3$ in appropriate molar proportion.

In the heating/cooling cycle, the furnace temperature was raised from ambient to 700° C. at a heating rate of 2° C./min. Thereafter, the heating rate was increased to 20° C./min. until a temperature of 897° C. was reached. This temperature was maintained in the furnace for a period of 40 hours. In the cooling cycle, the 897° C. furnace was allowed to cool to 650° C. at a rate of 0.5° C./min., whereupon the furnace was kept at 650° C. for 10 hours. The furnace was then shut down and allowed to cool to ambient. The resistivity curve generated using this composition is very similar to that shown in FIGS. 3-4, and confirmed a $T_c$ of slightly greater than 120° K. The oxide was also deemed to be of relatively high purity.

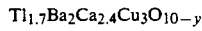
$Tl_{1.7}Ba_2Ca_{2.4}Cu_3O_{10-y}$

Figure 6:
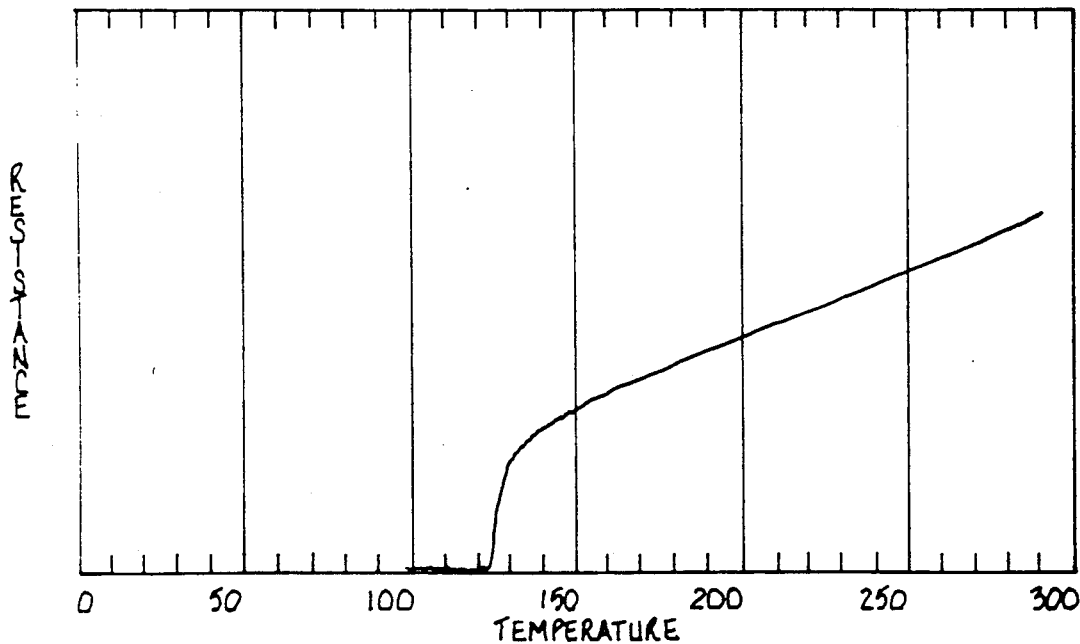
FIG. 6 is a resistivity curve generated using a superconductor $Tl_{1.7}Ba_2Ca_{2.4}Cu_3O_{10-y}$ fabricated in accordance with the invention.

In this example, a different heating cycle was employed, not including staged heating. This technique has been found useful for the fabrication of relatively small quantities of oxide. In any event, the oxide was produced by the exact same methods described previously, insofar as pellet formation and furnace placement was concerned. The heating/cooling cycle used involved the following steps: The furnace was heated to 890° C. at a rate of 10° C./min., whereupon the furnace was maintained at 890° C. for 48 hours. Thereafter, the furnace was allowed to cool to room temperature, at a rate of 0.8° C./min. A resistance vs. temperature (°K.) plot drive using this oxide is shown in FIG. 6, again confirming a $T_c$ in excess of 120° K.

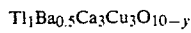
$Tl_1Ba_{0.5}Ca_3Cu_3O_{10-y}$

Figure 5:
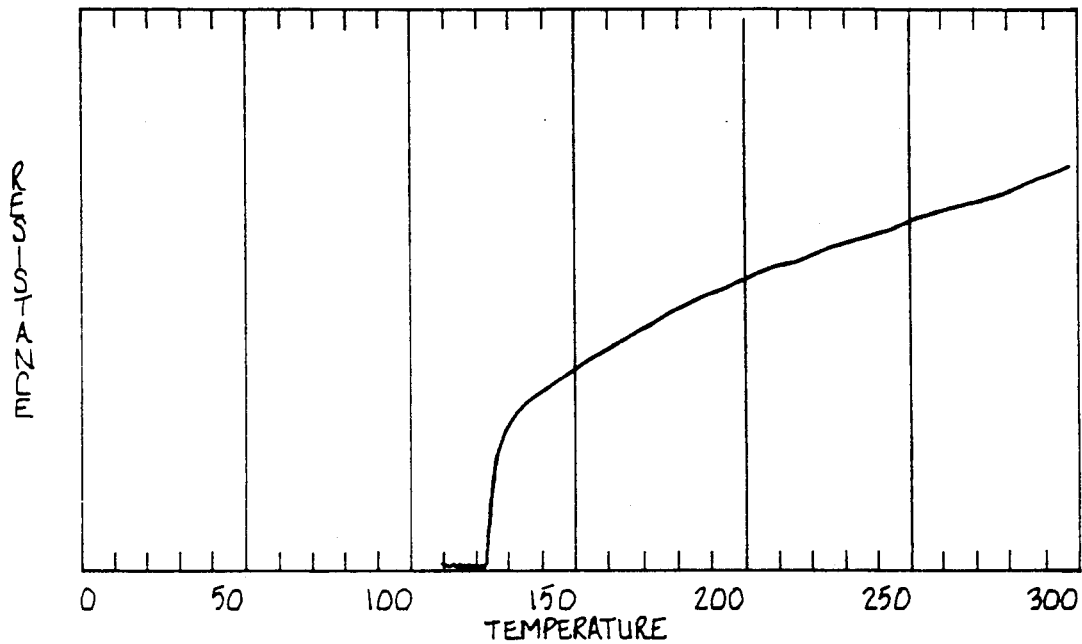
FIG. 5 is a resistivity curve generated using a superconductor $Tl_1Ba_{0.5}Ca_3Cu_3O_{10-y}$ which was fabricated pursuant to the present invention.

A small quantity sample of this oxide was prepared using the same steps outlined above for pellet formation and furnace placement. In the furnace, the following heating/cooling schedule was followed: The furnace temperature was raised at a rate of 10° C./min. until a temperature of 895° C. was reached, whereupon this temperature was maintained for a period of 48 hours. At this point, the furnace temperature was decreased to a rate of 0.8° C./min. to room temperature. The resistivity graph obtained from this sample is set forth as FIG. 5.

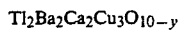
$Tl_2Ba_2Ca_2Cu_3O_{10-y}$

Figure 7:
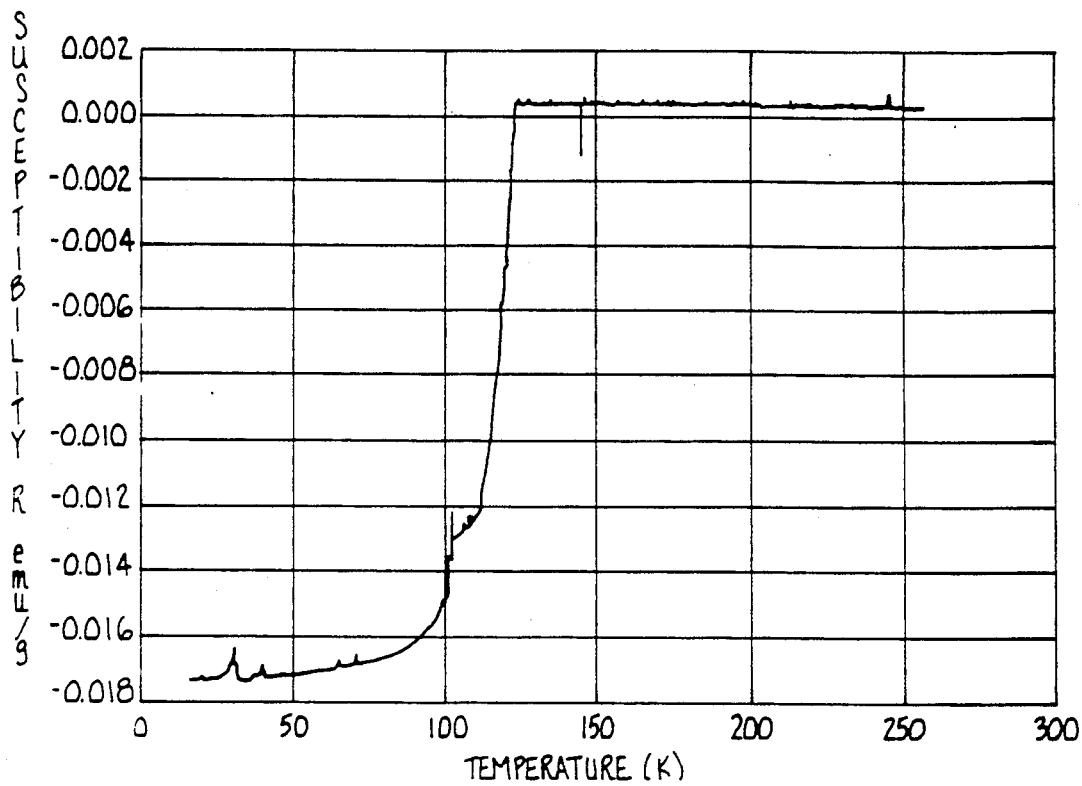
FIG. 7 is a susceptibility curve generated using a thallium-based superconductor produced in accordance with the prior art, and demonstrating the presence of significant 2122 phase in the superconductor.

This oxide was produced using conventional heating/cooling conditions. In particular, pellet formation and furnace placement were carried out as set forth in the first example, but the following heating/cooling protocol was used: The furnace temperature was increased at a rate of 20° C./min. until a temperature of 895° C. was reached, whereupon the temperature was maintained for a period of only 2 hours. The furnace was then cooled to 650° C. at a rate of 10° C./min., and this intermediate temperature was maintained for 10 hours. The furnace was then shut down, and cooled to ambient. The magnetic susceptibility curve generated using this sample is set forth in FIG. 7. It is noteworthy that the graph demonstrates the presence of significant additional phases, apart from the desired 2223 phase.

We claim:

1. A method of fabricating polycrystalline thallium-containing 2223 superconducting oxides using starting, non-superconducting oxides, said method comprising the steps of:
   providing quantities of said non-superconducting starting oxides for the fabrication of a final polycrystalline thallium 2223 superconducting oxide;
   forming a powdered, homogeneous mixture of said starting oxides;
   forming a self-sustaining body from said mixture;
   sintering said formed, self-sustaining body in an oxygen-rich atmosphere comprising at least about 50% by weight oxygen by initially sintering said body at a first, low heating rate to an intermediate temperature of from about 650° to about 750° C., and thereafter further sintering said body at a second heating rate higher than said first rate to a maximum temperature level of from about 850° to about 930° C., and maintaining said body at said maximum temperature level for a period of at least about 24 hours,
   said sintering being carried out for fabrication of a polycrystalline thallium 2223 superconducting oxide which comprises at least about 90% by weight 2223 phase; and
   cooling said body.

2. The method of claim 2, said first heating rate being from about 1° to about 10° C./min.

3. The method of claim 2, said first heating rate being from about 2° to about 5° C./min.

4. The method of claim 2, said second high heating rate being from about 15° to about 30° C./min.

5. The method of claim 4, wherein said second heating rate is about 20° C./min.

6. The method of claim 1, including the step of maintaining said body at said maximum temperature level for a period of from about 30 to about 60 hours.

7. The method of claim 1, including the step of cooling said body to ambient temperature.

8. The method of claim 7, said cooling step being carried out by cooling the body at a temperature rate of from about 0.1° to about 5° C./min.

9. The method of claim 1, including the step of cooling said body to a temperature of from about 600° to about 650° C., maintaining said temperature for a period of from about 5 to about 20 hours, and thereafter allowing the body to cool to ambient temperature.

10. The method of claim 1, said starting non-superconducting oxides comprising $Tl_2O_3$ and oxides barium, calcium and copper.

11. The method of claim 1, wherein said desired superconducting oxide has the general formula $Tl_xBa_zCa_qCu_dO_{10-y}$, where x ranges from about 1-2.5, z ranges from about 0.5-2, q ranges from about 1.5-3, d ranges from about 3 to about 4, and y is an oxygen deficiency factor which is less than about 1.

12. The method of claim 1, wherein said desired superconducting oxide has the general formula $Q_nTl_xBa_zCa_qCu_dO_{10-y}$, where Q is selected from the group consisting of Rb, Hg, Cr, Re, K, Na, Se, and Te, n ranges from about 0.05 to about 0.5, x ranges from about 1 to about 2.5, z ranges from about 0.5 to about 2, q ranges from about 1.5 to about 3, d ranges from about 3 to about 4, and y is an oxygen deficiency factor which is less than about 1.

* * * * *